United States Patent
Liu et al.

(10) Patent No.: US 11,521,416 B2
(45) Date of Patent: Dec. 6, 2022

(54) ULTRASONIC FINGERPRINT RECOGNITION SENSOR AND MANUFACTURING METHOD THEREOF, AND DISPLAY DEVICE

(71) Applicant: BEIJING BOE TECHNOLOGY DEVELOPMENT CO., LTD., Beijing (CN)

(72) Inventors: Yingming Liu, Beijing (CN); Haisheng Wang, Beijing (CN); Xiaoliang Ding, Beijing (CN); Lei Wang, Beijing (CN); Pengpeng Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/263,241

(22) PCT Filed: May 26, 2020

(86) PCT No.: PCT/CN2020/092268
§ 371 (c)(1),
(2) Date: Jan. 26, 2021

(87) PCT Pub. No.: WO2020/253477
PCT Pub. Date: Dec. 24, 2020

(65) Prior Publication Data
US 2021/0158005 A1   May 27, 2021

(30) Foreign Application Priority Data
Jun. 18, 2019   (CN) .......................... 201910527079.6

(51) Int. Cl.
*G06V 40/13* (2022.01)
*H01L 41/047* (2006.01)
(Continued)

(52) U.S. Cl.
CPC ...... *G06V 40/1306* (2022.01); *G06V 40/1329* (2022.01); *H01L 41/0474* (2013.01); *H01L 41/0805* (2013.01); *H01L 41/1132* (2013.01)

(58) Field of Classification Search
None
See application file for complete search history.

(56) References Cited

U.S. PATENT DOCUMENTS

2012/0092350 A1* 4/2012 Ganapathi ............. G06F 3/0447
29/829
2017/0110504 A1* 4/2017 Panchawagh ......... H01L 41/311
(Continued)

FOREIGN PATENT DOCUMENTS

CN   107092880 A   8/2017
CN   107145858 A   9/2017
(Continued)

OTHER PUBLICATIONS

First office action issued in Chinese Patent Application No. 201910527079.6 with search report.

*Primary Examiner* — Joseph R Haley
(74) *Attorney, Agent, or Firm* — Chiwin Law LLC

(57) ABSTRACT

An ultrasonic fingerprint recognition sensor and a manufacturing method thereof, and a display device are disclosed. The ultrasonic fingerprint recognition sensor includes a resonant cavity, a receiver electrode, a drive electrode, and a piezoelectric thin film layer between the receiver electrode and the drive electrode, the resonant cavity is on a side, closer to the piezoelectric thin film layer, of the receiver electrode, and is configured to increase vibration amplitude of the piezoelectric thin film layer.

18 Claims, 7 Drawing Sheets

(51) Int. Cl.
*H01L 41/08* (2006.01)
*H01L 41/113* (2006.01)

(56) References Cited

U.S. PATENT DOCUMENTS

| | | | | |
|---|---|---|---|---|
| 2017/0326594 A1* | 11/2017 | Berger | .................... | G10K 9/122 |
| 2019/0050618 A1* | 2/2019 | Khuri-Yakub | .......... | H04M 1/03 |
| 2020/0242316 A1 | 7/2020 | Liu et al. | | |
| 2021/0350098 A1* | 11/2021 | Zhou | .................... | G06F 1/1637 |

FOREIGN PATENT DOCUMENTS

| | | |
|---|---|---|
| CN | 108363950 A | 8/2018 |
| CN | 109492623 A | 3/2019 |
| CN | 109561876 A | 4/2019 |
| CN | 109643378 A | 4/2019 |
| CN | 109815918 A | 5/2019 |
| CN | 109829419 A | 5/2019 |
| CN | 110232363 A | 9/2019 |
| WO | 2018169298 A1 | 9/2018 |

* cited by examiner

ULTRASONIC FINGERPRINT RECOGNITION SENSOR AND MANUFACTURING METHOD THEREOF, AND DISPLAY DEVICE

CROSS REFERENCE TO RELATED APPLICATIONS

This application is a U.S. National Phase Entry of International Application No. PCT/CN2020/092268 filed on May 26, 2020, designating the United States of America and claiming priority to Chinese Patent Application No. 201910527079.6, filed on Jun. 18, 2019. The present application claims priority to and the benefit of the above-identified applications and the above-identified applications are incorporated by reference herein in their entirety for all purposes.

TECHNICAL FIELD

Embodiments of the present disclosure relate to an ultrasonic fingerprint recognition sensor and a manufacturing method thereof, and a display device.

BACKGROUND

An ultrasonic fingerprint recognition technology carries out fingerprint recognition by using an ability of an ultrasonic wave to penetrate materials and generate echoes of different intensities depending on the materials (i.e., when the ultrasonic wave reaches surfaces of different materials, ultrasonic energy reflected back and distances traveled are different); and as compared with a capacitive fingerprint recognition device, an ultrasonic fingerprint recognition device has better performance, due to advantages such as water proof and sweat proof, large-area sensor, recognition of fake fingerprint, and capability of setting thicker protective cover. Therefore, the ultrasonic fingerprint recognition technology, by using a difference in acoustic impedance between skin and air, can distinguish locations of a ridge and a valley of a fingerprint, can carry out more in-depth analysis and sampling of the fingerprint, and can even penetrate under a skin surface to recognize unique three-dimensional features of the fingerprint. In addition, the ultrasonic wave may also recognize other physiological characteristics such as pulse and blood pressure.

SUMMARY

At least one embodiment of the present disclosure provides an ultrasonic fingerprint recognition sensor, which comprises: a receiver electrode, a drive electrode, a piezoelectric thin film layer and a resonant cavity. The piezoelectric thin film layer is between the receiver electrode and the drive electrode; and the resonant cavity is on a side, closer to the piezoelectric thin film layer, of the receiver electrode, and is configured to increase vibration amplitude of the piezoelectric thin film layer.

For example, in at least one example of the ultrasonic fingerprint recognition sensor, the resonant cavity is on a side, away from the piezoelectric thin film layer, of the drive electrode.

For example, in at least one example of the ultrasonic fingerprint recognition sensor, a support body is provided on a side, away from the piezoelectric thin film layer, of the drive electrode; a protective layer is provided on a side, away from the drive electrode, of the support body; and the drive electrode, the support body and the protective layer together form the resonant cavity.

For example, in at least one example of the ultrasonic fingerprint recognition sensor, the resonant cavity is between the piezoelectric thin film layer and the drive electrode.

For example, in at least one example of the ultrasonic fingerprint recognition sensor, the resonant cavity is located between the piezoelectric thin film layer and the receiver electrode.

For example, in at least one example of the ultrasonic fingerprint recognition sensor, the resonant cavity is a closed and airtight empty cavity.

For example, in at least one example of the ultrasonic fingerprint recognition sensor, a shape of an orthogonal projection of the resonant cavity on the drive electrode is polygonal, circular or elliptical.

For example, in at least one example of the ultrasonic fingerprint recognition sensor, the ultrasonic fingerprint recognition sensor comprises a plurality of receiver electrodes that are spaced apart and a plurality of resonant cavities; and each of the resonant cavities overlaps with a corresponding one of the receiver electrodes in a direction perpendicular to the ultrasonic fingerprint recognition sensor.

For example, in at least one example of the ultrasonic fingerprint recognition sensor, the drive electrode is a transparent planar electrode; and the drive electrode covers the piezoelectric thin film layer.

For example, in at least one example of the ultrasonic fingerprint recognition sensor, the ultrasonic fingerprint recognition sensor further comprises a driving circuit. The driving circuit is configured to at least apply a voltage to the drive electrode, and change a polarity of a difference between a voltage on the drive electrode and a voltage on the receiver electrode, in an ultrasonic wave generation phase.

For example, in at least one example of the ultrasonic fingerprint recognition sensor, the ultrasonic fingerprint recognition sensor further comprises a base. The base comprises a signal readout circuit; and the signal readout circuit is electrically connected with the receiver electrode.

At least one embodiment of the present disclosure further provides a display device, which comprises: the above-mentioned ultrasonic fingerprint recognition sensor, and a display panel. The ultrasonic fingerprint recognition sensor is attached onto a non-light emitting side of the display panel.

For example, in at least one example of the display device, the ultrasonic fingerprint recognition sensor completely covers the display panel in a direction perpendicular to the display device.

For example, in at least one example of the display device, the display panel comprises a light-emitting unit and a driving substrate; the ultrasonic fingerprint recognition sensor further comprises a protective layer and a base; and the protective layer, the resonant cavity, the drive electrode, the piezoelectric thin film layer, the receiver electrode, the base, the driving substrate, and the light-emitting unit are sequentially arranged in the direction perpendicular to the display device.

For example, in at least one example of the display device, the display panel is an organic light-emitting diode display panel or a quantum dot display panel.

At least one embodiment of the present disclosure further provides a manufacturing method of the ultrasonic fingerprint recognition sensor, which comprises: forming the receiver electrode; forming the piezoelectric thin film layer on the receiver electrode; forming the drive electrode on the piezoelectric thin film layer; and forming the resonant cavity on the drive electrode.

For example, in at least one example of the manufacturing method, the forming the resonant cavity on the drive electrode comprises: forming a sacrificial layer on the drive electrode; forming a support layer on the sacrificial layer, and forming a hole, that penetrates the support layer and connects with the sacrificial layer, in the support layer; etching, through the hole that penetrates the support layer, a region, corresponding to the hole that penetrates the support layer, of the sacrificial layer, to form a groove; and forming a protective layer covering the groove on the support layer, so as to form the resonant cavity.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Inventors of the present disclosure have noticed during research that an ultrasonic fingerprint recognition device has relatively poor fingerprint recognition performance. Exemplary description will be given below with reference to FIG. 1A to FIG. 1C.

Figure 1A:
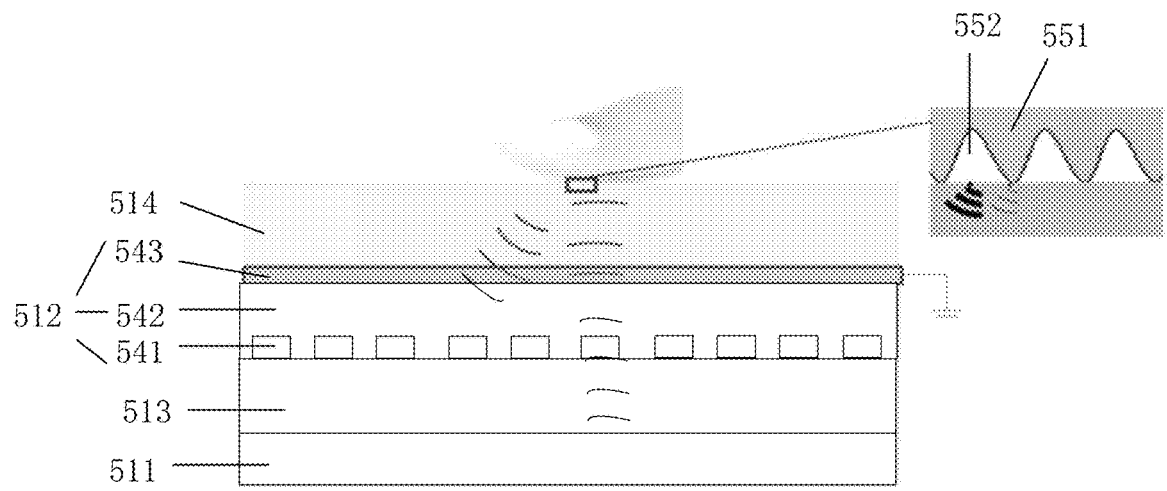
FIG. 1A is a cross-sectional schematic diagram of an ultrasonic fingerprint recognition device.

FIG. 1A is a cross-sectional schematic diagram of an ultrasonic fingerprint recognition device. As shown in FIG. 1A, the ultrasonic fingerprint recognition device includes a sound wave generation element 511, a substrate 513, and a sound wave receiver element 512 arranged in sequence. For example, as shown in FIG. 1A, the ultrasonic fingerprint recognition device further includes a protective layer 514; and during operation, a user's finger contacts the protective layer 514.

For example, the sound wave generation element 511 is configured to emit a sound wave (e.g., an ultrasonic wave) under an action of an alternating-current voltage; and the sound wave receiver element 512 is configured to receive the sound wave (e.g., the ultrasonic wave) and convert the received sound wave into an electric signal.

Figure 1B:
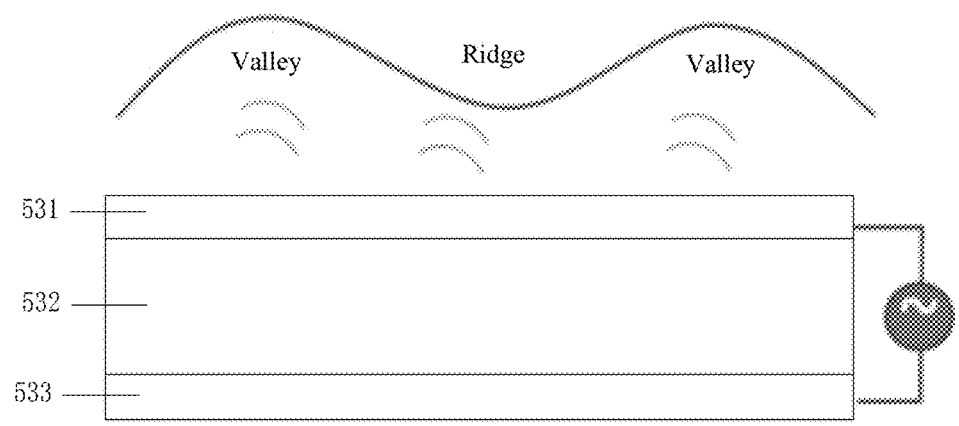
FIG. 1B is a cross-sectional schematic diagram of a sound wave generation element shown in FIG. 1A.
Figure 1C:
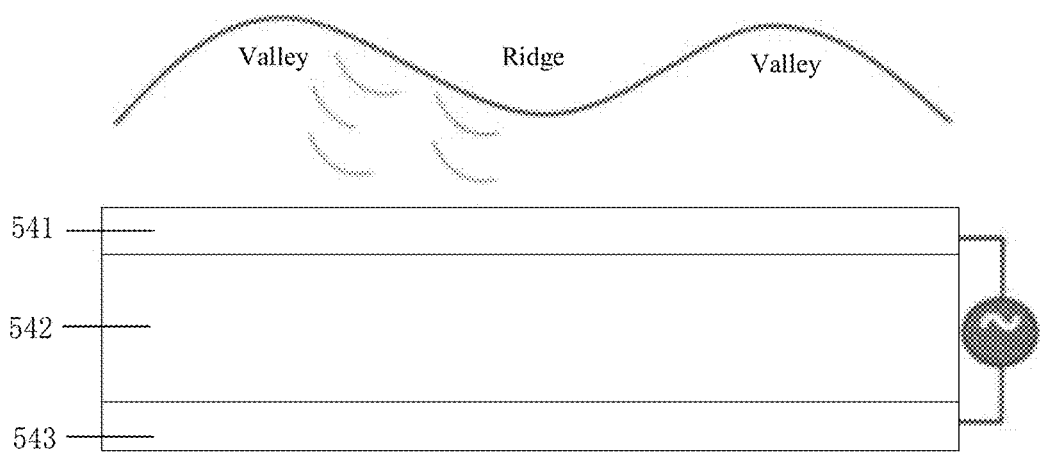
FIG. 1C is a cross-sectional schematic diagram of a sound wave receiver element shown in FIG. 1A.

FIG. 1B is a cross-sectional schematic diagram of the sound wave generation element 511 shown in FIG. 1A; and FIG. 1C is a cross-sectional schematic diagram of the sound wave receiver element 512 shown in FIG. 1A.

As shown in FIG. 1B, the sound wave generation element 511 includes a first electrode 531 (e.g., a first upper electrode), a second electrode 533 (e.g., a first lower electrode), and a first piezoelectric material layer 532 located between the first electrode 531 (e.g., the first upper electrode) and the second electrode 533 (e.g., the first lower electrode).

The sound wave receiver element 512 and the sound wave generation element 511 may have similar structures. For example, as shown in FIG. 1C, the sound wave receiver element 512 includes a third electrode 541 (e.g., a second upper electrode), a fourth electrode 543 (e.g., a second lower electrode), and a second piezoelectric material layer 542 located between the third electrode 541 (e.g., the second upper electrode) and the fourth electrode 543 (e.g., the second lower electrode).

A working principle of the ultrasonic fingerprint recognition device shown in FIG. 1A will be described below. For ease of description, description will be given below by directly using the upper electrode and the lower electrode.

As shown in FIG. 1B, the first upper electrode and the first lower electrode in the sound wave generation element 511 are configured to receive an alternating-current voltage (an AC voltage). For example, a driving circuit may be used to input the AC voltage to the first upper electrode and the first lower electrode in the sound wave generation element 511 (e.g., the first upper electrode is applied with a ground voltage, and the first lower electrode is applied with an AC square wave voltage); and under an action of the AC voltage, a piezoelectric material (i.e., a piezoelectric material of the first piezoelectric material layer 532) is deformed and vibrates. For example, the piezoelectric material vibrates in a direction in which the first upper electrode is opposed to the first lower electrode, that is, the piezoelectric material is bent and deformed in an up-down direction shown in FIG. 1B (or the piezoelectric material drives bases of upper and lower film layers to vibrate together), to generate a sound wave (e.g., an ultrasonic wave), and send out the sound wave.

As shown in FIG. 1A, during operation, the sound wave generated by the sound wave generation element 511 is propagated toward the protective layer 514; when the sound wave is propagated to the place where the fingerprint in contact with the protective layer 514 is located, the sound wave is reflected by the fingerprint. For example, as shown in FIG. 1A, there is air 552 between a valley of the fingerprint and the protective layer; and a ridge of the fingerprint is in contact with the protective layer. For example, as shown in FIG. 1A, the ridge and the valley of the fingerprint have different reflectivity for the sound wave generated by the sound wave generation element 511 and propagated toward finger skin 551, that is, energy of the sound wave reflected by the ridge of the fingerprint is different from energy of the sound wave reflected by the valley of the fingerprint. For example, as shown in FIG. 1A, the energy of the sound wave reflected by the ridge of the fingerprint is less than the energy of the sound wave reflected by the valley of the fingerprint.

As shown in FIG. 1A, during operation, the sound wave reflected by the fingerprint is incident onto the sound wave receiver element 512 and cause a piezoelectric material of the sound wave receiver element 512 to vibrate (e.g., vibrate in a direction in which the second upper electrode is opposed to the second lower electrode); the piezoelectric material of the sound wave receiver element 512 converts the vibration into an electric signal (e.g., an AC voltage); because the energy reflected by the ridge is different from the energy reflected by the valley of the fingerprint, sound waves incident onto different regions of the sound wave receiver element 512 have different intensities, vibration amplitudes of different regions of the sound wave receiver element 512 are different; correspondingly, vibration amplitudes of different regions of the second piezoelectric material layer 542 are different, intensities (e.g., average intensities) of AC voltages output by different regions of the second piezoelectric material layer 542 are different; and therefore, fingerprint recognition can be carried out based on intensity distribution of the output AC voltages.

The inventors of the present disclosure have noticed in research that the piezoelectric material (e.g., at least one of the first piezoelectric material layer 532 and the second piezoelectric material layer 542) in the ultrasonic fingerprint recognition device shown in FIG. 1A has a small vibration amplitude, which makes at least one of the intensity of the sound wave generated by the sound wave generation element 511 and the intensity of the AC voltage signal output by the sound wave receiver element 512 to be relatively small, thereby possibly affecting detection sensitivity of the ultrasonic fingerprint recognition device.

For example, signals of the sound wave reflected to the piezoelectric material (the piezoelectric material of the second piezoelectric material layer 542) are different, and the piezoelectric material converts the reflected signals into AC voltages, thereby realizing fingerprint recognition. Such a fingerprint recognition mode requires vibration of piezoelectric material to emit a sound wave and form an electric signal for recognizing fingerprints.

Non-limitative descriptions are given to an ultrasonic fingerprint recognition sensor provided by embodiments of the present disclosure in the following with reference to a plurality of examples. As described in the following, in case of no conflict, different features in these specific examples may be combined so as to obtain new examples, and the new examples are also fall within the scope of present disclosure.

It should be noted that, for convenience of description, the acoustic fingerprint recognition sensor is directly described as an ultrasonic fingerprint recognition sensor below, but the embodiments of the present disclosure are not limited to using an ultrasonic wave to implement fingerprint recognition; according to actual application needs, the embodiments of the present disclosure may also use other applicable sound wave to implement fingerprint recognition.

Figure 2A:
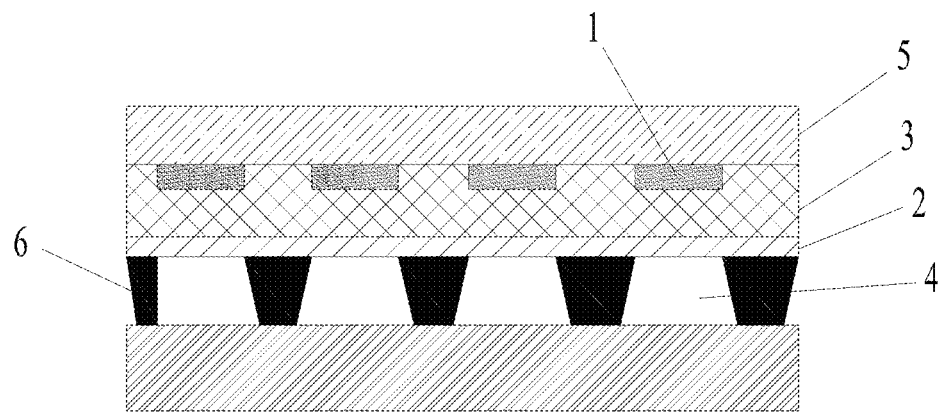
FIG. 2A is a structural schematic diagram of an ultrasonic fingerprint recognition sensor provided by some embodiments of the present disclosure.

FIG. 2A is a structural schematic diagram (e.g., a cross-sectional schematic diagram) of an ultrasonic fingerprint recognition sensor provided by some embodiments of the present disclosure. As shown in FIG. 2A, the ultrasonic fingerprint recognition sensor includes a receiver electrode 1, a drive electrode 2, and a piezoelectric thin film layer 3 provided between the receiver electrode 1 and the drive electrode 2, as well as a resonant cavity 4 provided on a side of the receiver electrode 1 that is closer to the piezoelectric thin film layer 3. The resonant cavity 4 is used to increase vibration amplitude of the piezoelectric thin film layer 3, so as to enhance detection sensitivity of the ultrasonic fingerprint recognition sensor.

For example, as shown in FIG. 2A, the ultrasonic fingerprint recognition sensor includes a plurality of receiver electrodes 1. For example, as shown in FIG. 2A, the plurality of receiver electrodes 1 are spaced apart. For example, the receiver electrode 1 is in direct contact with the piezoelectric thin film layer 3; and the drive electrode 2 is in direct contact with the piezoelectric thin film layer 3.

For example, the laminate structure of the receiver electrode 1, the piezoelectric thin film layer 3 and the drive electrode 2 not only can be used to emit an ultrasonic wave, but also can convert an ultrasonic wave that is reflected by a fingerprint and incident onto the above-described laminate structure into an electric signal. For example, the piezoelectric thin film layer 3 converts a driving voltage applied to at least one of the receiver electrode 1 and the drive electrode 2 into mechanical motion based on a piezoelectric effect, so as to generate an ultrasonic wave; the piezoelectric thin film layer 3 converts the mechanical motion caused by the ultrasonic wave that is reflected by a fingerprint to be detected and incident onto the above-described laminate structure into an electric signal based on the piezoelectric effect. For example, the above-described laminate structure realizes a function of emitting an ultrasonic wave and a function of converting the ultrasonic wave into an electric signal in a time division manner. Exemplary description will be given below with reference to FIG. 2B.

Figure 2B:
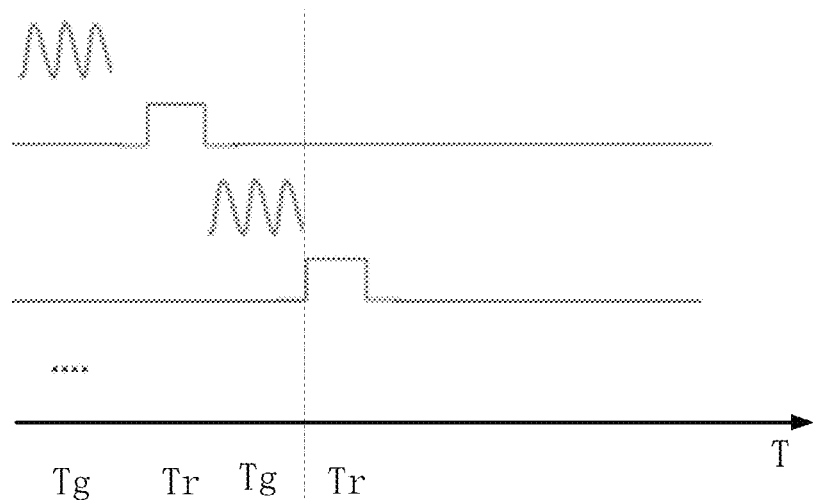
FIG. 2B is a driving timing diagram of the ultrasonic fingerprint recognition sensor shown in FIG. 2A.

FIG. 2B is a driving timing diagram of the ultrasonic fingerprint recognition sensor shown in FIG. 2A. For example, as shown in FIG. 2B, in the time dimension T, each operation cycle of the ultrasonic fingerprint recognition sensor includes an ultrasonic wave generation phase Tg and an ultrasonic wave reception phase Tr that are alternately arranged.

For example, as shown in FIG. 2B, in the ultrasonic wave generation phase, the drive electrode 2 is applied with a driving voltage (e.g., an alternating-current voltage, that is, a voltage that changes a polarity or a sign of a voltage difference between the drive electrode 2 and the receiver electrode 1); the receiver electrode 1 is applied with a fixed voltage (e.g., a ground voltage, for example, 0 volts); and under excitation of the driving voltage and the fixed voltage, the piezoelectric thin film layer 3 is deformed and vibrates (e.g., vibrates in a direction in which the receiver electrode 1 is opposed to the drive electrode 2), and generates a sound wave (e.g., an ultrasonic wave).

For example, as shown in FIG. 2B, in the ultrasonic wave reception phase, the above-described sound wave generated is reflected by the fingerprint to be detected and then is incident onto the laminate structure of the receiver electrode 1, the piezoelectric thin film layer 3, and the drive electrode 2, making the piezoelectric thin film layer 3 to vibrate (e.g., vibrate in the direction in which the receiver electrode 1 is opposed to the drive electrode 2); and the piezoelectric thin film layer 3 converts the vibration caused by a sound wave (e.g., an ultrasonic wave) reflected back by the fingerprint to be detected into an electric signal (e.g., an alternating-current voltage). For example, as shown in FIG. 2B, in the ultrasonic wave reception phase, applying of the driving voltage to the drive electrode 2 is stopped, and the drive electrode 2 is applied with a fixed voltage (e.g., the ground voltage, for example, 0 volts), to obtain an electric signal output by the receiver electrode 1.

For example, as shown in FIG. 2B, each operation cycle of the ultrasonic fingerprint recognition sensor includes a plurality of ultrasonic wave reception phases; in each of the plurality of ultrasonic wave reception phases, receiver electrodes 1 located in some rows (or some columns) output an electric signal; and correspondingly, each operation cycle of the acoustic fingerprint recognition sensor includes a plurality of ultrasonic wave generation phases.

For example, in each of the plurality of ultrasonic wave generation phases, the drive electrode 2 is applied with a driving voltage (e.g., an alternating-current voltage), and the receiver electrode 1 is applied with a fixed voltage (e.g., a ground voltage), so that the piezoelectric thin film layer 3, under excitation of the driving voltage and the fixed voltage, is deformed, vibrates and generates an ultrasonic wave. For example, in a first ultrasonic wave reception phase Tr shown in FIG. 2B (from left to right), receiver electrodes 1 located in rows 1 to 10 output an electric signal; in a second ultrasonic wave reception phase Tr shown in FIG. 2B (from left to right), receiver electrodes 1 located in rows 11 to 20 output an electric signal; and so on, until all the receiver electrodes 1 output an electric signal.

For example, the ultrasonic fingerprint recognition sensor provided by some embodiments of the present disclosure may further include a driving circuit 101 (not shown in FIG. 2A, referring to FIG. 2C); and the driving circuit 101 is respectively electrically connected with the receiver electrode 1 and the drive electrode 2, to respectively apply a driving voltage (e.g., the alternating-current voltage) and a fixed voltage (e.g., the ground voltage) to the drive electrode 2 and the receiver electrode 1 in the ultrasonic wave generation phase. For another example, the driving circuit 101 may be electrically connected with the drive electrode 2; and a signal readout circuit is electrically connected with the receiver electrode 1 and applies the fixed voltage to the receiver electrode 1.

For example, the ultrasonic fingerprint recognition sensor provided by some embodiments of the present disclosure may further include a signal readout circuit 102 (not shown in FIG. 2A, referring to FIG. 2C and FIG. 2G); and the signal readout circuit 102 is electrically connected with the receiver electrode 1, to acquire an electric signal from the receiver electrode 1 in the ultrasonic wave generation phase. For example, in the ultrasonic wave generation phase, the drive electrode 2 receives the ground voltage.

Figure 2C:
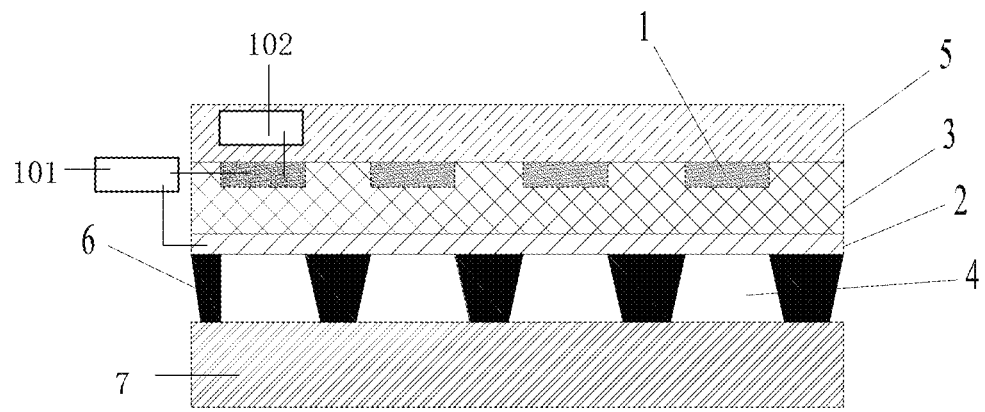
FIG. 2C is another structural schematic diagram of an ultrasonic fingerprint recognition sensor provided by some embodiments of the present disclosure.
Figure 2D:
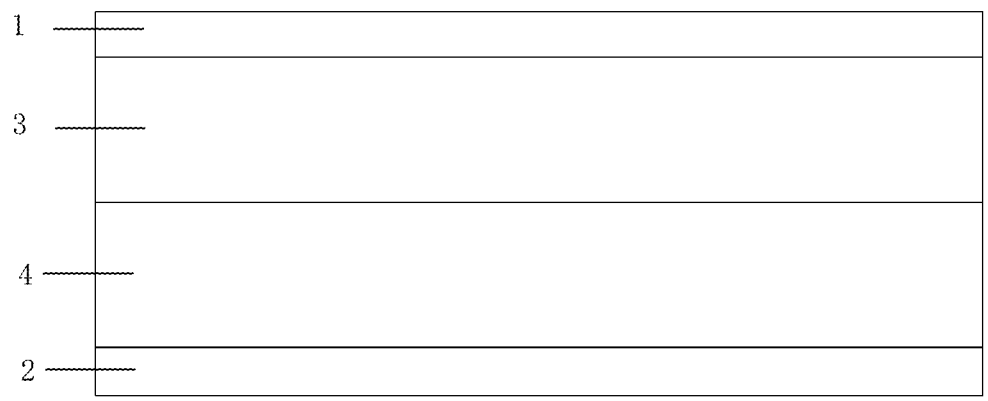
FIG. 2D is a structural schematic diagram of another ultrasonic fingerprint recognition sensor provided by some embodiments of the present disclosure.
Figure 2E:
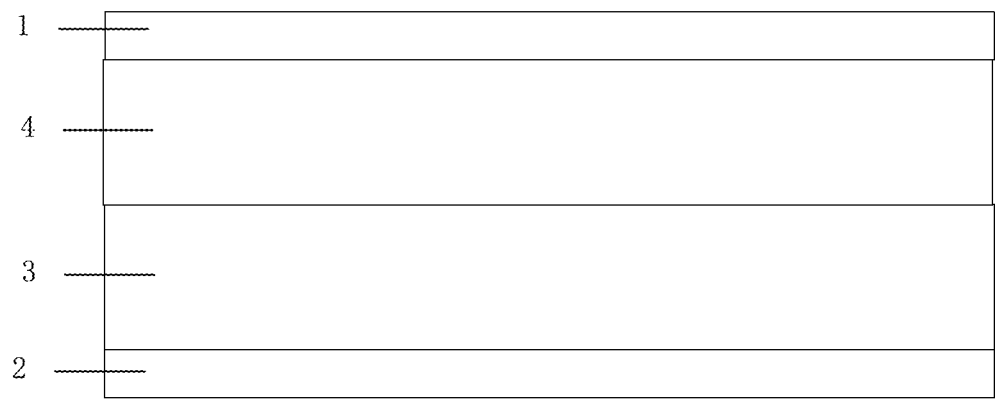
FIG. 2E is a structural schematic diagram of a further ultrasonic fingerprint recognition sensor provided by some embodiments of the present disclosure.
Figure 2F:
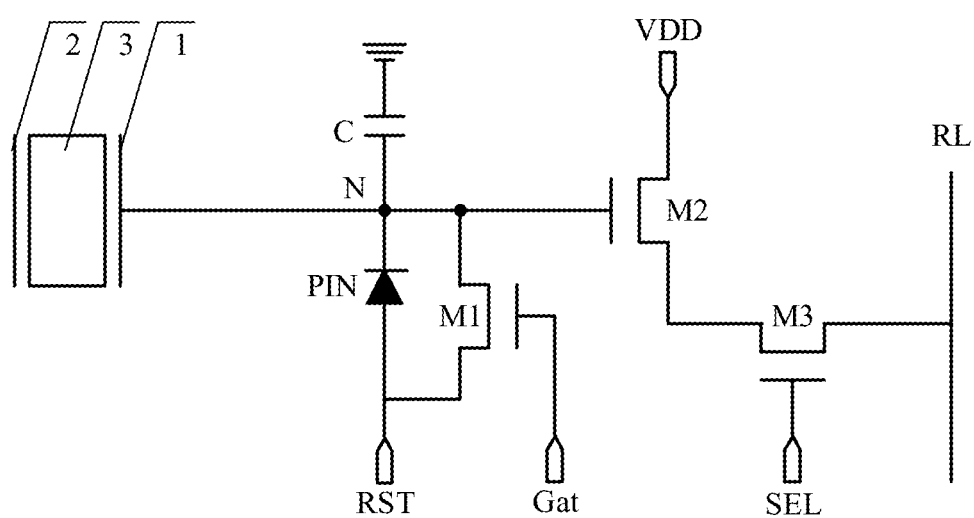
FIG. 2F is an equivalent circuit diagram of a signal readout circuit provided by some embodiments of the present disclosure.

For example, as shown in FIG. 2F, the signal readout circuit provided by some embodiments of the present disclosure includes: a storage capacitor C, a first transistor M1, a second transistor M2, a third transistor M3, and a diode PIN. For example, the receiver electrode 1 is connected with a node N; a first end of the storage capacitor C is connected with the node N; a second end of the storage capacitor C is connected with the ground; an anode of the diode PIN is connected with a reset signal terminal RST; a cathode of the diode PIN is connected with the node N; a control terminal of the first transistor M1 is connected with a scan signal terminal Gat; a first electrode of the first transistor M1 is connected with the node N; a second electrode of the first transistor M1 is connected with the reset signal terminal RST; a control terminal of the second transistor M2 is connected with the node N; a first electrode of the second transistor M2 is connected with a power signal terminal VDD; a second electrode of the second transistor M2 is connected with a first electrode of the third transistor M3; a control terminal of the third transistor M3 is connected with a read control terminal SEL; and a second electrode of the third transistor M3 is connected with a read signal line RL. For example, the storage capacitor C is used to store the electric signal received by the receiver electrode 1. The second transistor M2 and the third transistor M3 are used to read the electric signal stored in the storage capacitor C.

Figure 2G:
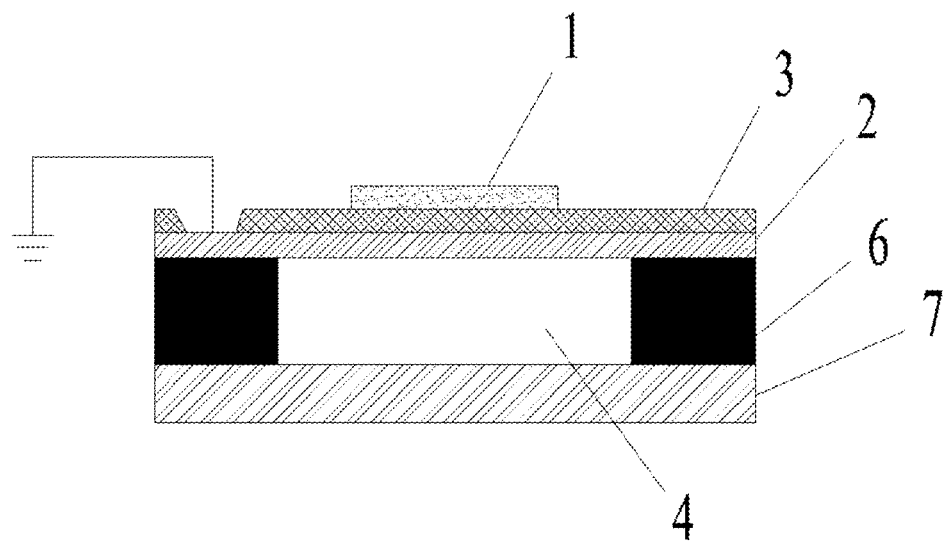
FIG. 2G is a structural schematic diagram of the ultrasonic fingerprint recognition sensor, when the piezoelectric thin film layer of the ultrasonic fingerprint recognition sensor does not vibrate, provided by some embodiments of the present disclosure.

For example, as shown in FIG. 2G in a case where the first transistor M1 is turned on, a reset signal (e.g., a reset voltage) supplied by the reset signal terminal RST can reset the node N. For example, the reset voltage supplied by the reset signal terminal RST may be equal to the fixed voltage (e.g., the ground voltage); in this case, the fixed voltage may be applied to the receiver electrode 1 by resetting the node N. For example, in a case where the second transistor M2 and the third transistor M3 are turned on, the electric signal on the node N and the receiver electrode 1 may be acquired via the read signal line RL.

For example, the resonant cavity is located on the side of the receiver electrode 1 that is closer to the piezoelectric thin film layer 3. For example, as shown in FIG. 2A, the resonant cavity 4 is formed on a side of the drive electrode 2 that is away from the piezoelectric thin film layer 3. For example, the receiver electrode 1 and the drive electrode 2 share the piezoelectric thin film layer 3, the drive electrode 2 drives the piezoelectric thin film layer 3 to vibrate and emit an ultrasonic signal, the ultrasonic signal is emitted toward the receiver electrode 1 and passes through the receiver electrode 1; then, the ultrasonic signal is reflected by the fingerprint and reflected onto the receiver electrode 1, and the receiver electrode 1 receives the ultrasonic signal that is reflected back, and makes the piezoelectric thin film layer 3 vibrate to form an electric signal for recognizing the fingerprint.

For example, because the resonant cavity is located on the side of the receiver electrode 1 that is closer to the piezoelectric thin film layer 3, the ultrasonic signal does not pass through the resonant cavity during the process of propagating toward the receiver electrode 1 after being reflected by the fingerprint, so as to prevent the resonant cavity from adversely affecting the ultrasonic signal reflected by the fingerprint.

FIG. 2D is a structural schematic diagram of another ultrasonic fingerprint recognition sensor provided by some embodiments of the present disclosure; and FIG. 2E is a structural schematic diagram of a further ultrasonic fingerprint recognition sensor provided by some embodiments of the present disclosure. In some embodiments, as shown in FIG. 2D, the resonant cavity 4 may be located between the piezoelectric thin film layer 3 and the drive electrode 2; in some embodiments, as shown in FIG. 2E, the resonant cavity 4 may be located between the piezoelectric thin film layer 3 and the receiver electrode 1; in the above-described embodiment, by applying a breakdown voltage (e.g., a voltage that makes gas such as air in the resonant cavity conductive) to the receiver electrode and the drive electrode, breakdown of the resonant cavity is caused, so as to realize an electrical connection of the receiver electrode and the drive electrode with piezoelectric thin film layer.

For example, as shown in FIG. 2A, the ultrasonic fingerprint recognition sensor provided by some embodiments of the present disclosure may further include a base 5; and the receiver electrode 1, the drive electrode 2, the piezoelectric thin film layer 3, and the resonant cavity 4 are all provided on the base 5. For example, as shown in FIG. 2A, the receiver electrode 1, the drive electrode 2, the piezoelectric thin film layer 3, and the resonant cavity 4 are all arranged on the same side of the base 5.

For example, the ultrasonic fingerprint recognition sensor includes a plurality of signal readout circuits; and the plurality of signal readout circuits are respectively electrically connected with the plurality of receiver electrodes 1.

For example, as shown in FIG. 2F, each signal readout circuit includes a thin film transistor; and at least one thin film transistor of each signal readout circuit is electrically connected with a corresponding one of the receiver electrodes 1. For example, the base 50 includes a signal readout circuit; and in this case, the base 50 is a thin film transistor substrate.

It should be noted that, for the sake of clarity, FIG. 2C only shows the connection of one receiver electrode 1 with the driving circuit 101 and the signal readout circuit 102 respectively; the connections of other receiver electrodes 1 with the driving circuit 101 and the signal readout circuit 102 may be set with reference to FIG. 2C, and no details will be repeated here.

For example, an orthogonal projection of the drive electrode 2 on the base 5 completely overlaps an orthogonal projection of the piezoelectric thin film layer 3 on the base 5.

Hereinafter, technical solutions of some embodiments of the present disclosure will be described in detail through specific embodiments or examples.

Figure 3:
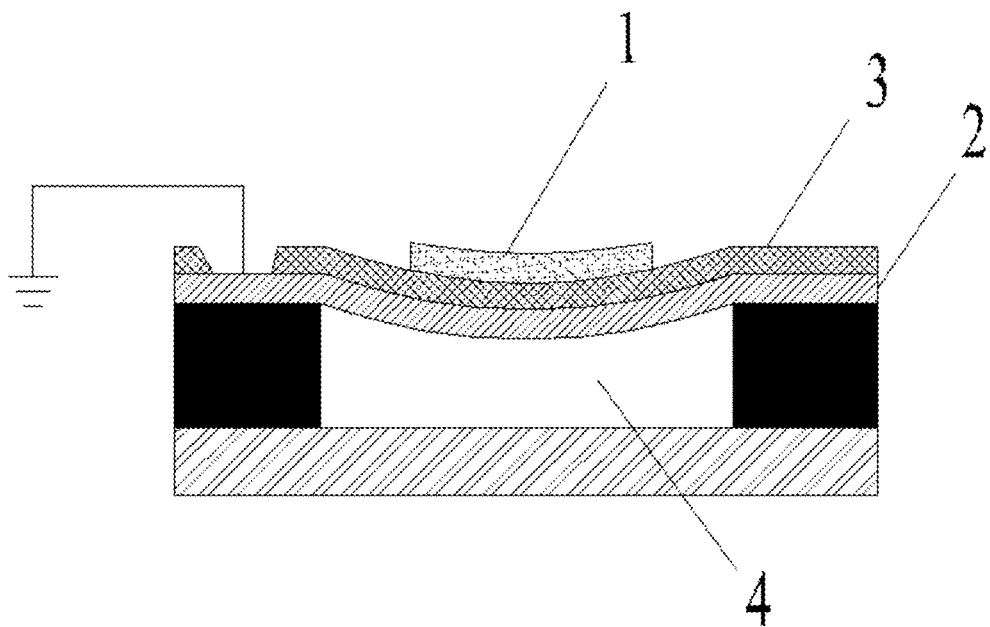
FIG. 3 is a structural schematic diagram of the ultrasonic fingerprint recognition sensor, when the piezoelectric thin film layer of the ultrasonic fingerprint recognition sensor contracts, provided by some embodiments of the present disclosure.
Figure 4:
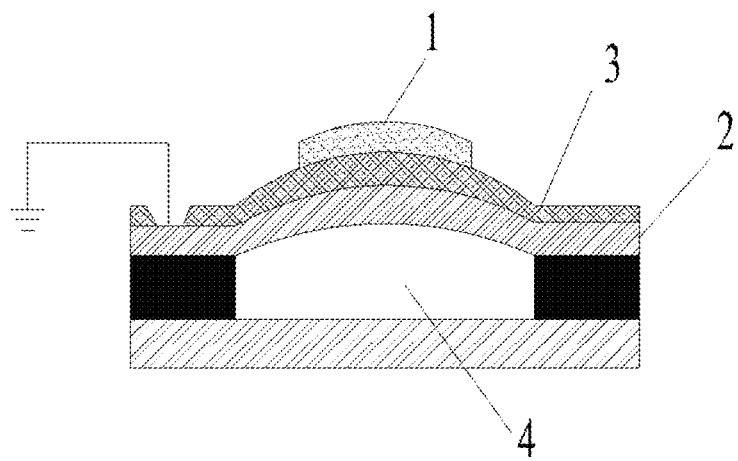
FIG. 4 is a structural schematic diagram of the ultrasonic fingerprint recognition sensor, when the piezoelectric thin film layer of the ultrasonic fingerprint recognition sensor expands, provided by some embodiments of the present disclosure.

FIG. 2G is a structural schematic diagram, when the piezoelectric thin film layer in the ultrasonic fingerprint recognition sensor does not vibrate, of the ultrasonic fingerprint recognition sensor provided by some embodiments of the present disclosure; FIG. 3 is a structural schematic diagram, when the piezoelectric thin film layer in the ultrasonic fingerprint recognition sensor contracts, of the ultrasonic fingerprint recognition sensor provided by some embodiments of the present disclosure; and FIG. 4 is a structural schematic diagram, when the piezoelectric thin film layer in the ultrasonic fingerprint recognition sensor expands, of the ultrasonic fingerprint recognition sensor provided by some embodiments of the present disclosure. Hereinafter, description will be given by taking the case where the resonant cavity is formed on the side of the drive electrode 2 that is away from the piezoelectric thin film layer 3 as an example. For example, the expression "piezoelectric thin film layer contracts" means that a volume of the resonant cavity 4 is reduced so that part region (e.g., a region overlapping with the receiver electrode 1) of the piezoelectric thin film layer is closer (as compared with the example shown in FIG. 2G) to the protective layer 7; and the expression "the piezoelectric thin film layer expands" means that the volume of the resonant cavity 4 increases so that part region (e.g., the region overlapping with the receiver electrode 1) of the piezoelectric thin film layer is farther away (as compared with the example shown in FIG. 2G) from the protective layer 7.

As shown in FIG. 2G FIG. 3 and FIG. 4, the ultrasonic fingerprint recognition sensor provided by some embodiments of the present disclosure includes the base, and the receiver electrode 1 and the piezoelectric thin film layer 3 that are arranged on the base, as well as a drive electrode 2 provided on a side of the piezoelectric thin film layer 3 that is away from the receiver electrode 1; and the receiver electrode 1 and the drive electrode 2 are respectively electrically connected with the piezoelectric thin film layer 3 to share the piezoelectric thin film layer 3. The side of the drive electrode 2 that is away from the piezoelectric thin film layer 3 is provided with the resonant cavity 4; and the resonant cavity 4 is used to increase the vibration amplitude of the piezoelectric thin film layer 3, thereby improving detection sensitivity of the ultrasonic fingerprint recognition sensor provided by some embodiments of the present disclosure.

For example, by selecting a suitable alternating-current voltage (e.g., by making the driving circuit to supply a suitable alternating-current voltage), the vibration of the piezoelectric thin film layer 3 can cause resonance between the resonant cavity 4 and the piezoelectric thin film layer 3, so that the vibration amplitude of the piezoelectric thin film layer 3 can be increased. For example, the alternating-current voltage that can induce resonance between the resonant cavity 4 and the piezoelectric thin film layer 3 can be measured through experiments, and no details will be repeated here.

For example, as shown in FIG. 2G when the drive electrode 2 applies no alternating-current voltage to the piezoelectric thin film layer 3, the piezoelectric thin film layer 3 does not vibrate and does not emit an ultrasonic wave. For example, as shown in FIG. 3 and FIG. 4, when the drive electrode 2 applies an alternating-current voltage to the piezoelectric thin film layer 3, the piezoelectric thin film layer 3 vibrates; and under an action of the resonant cavity 4, the piezoelectric thin film layer 3 vibrates (e.g., contracts and expands) with a larger amplitude (as compared with the example in which the resonant cavity 4 is not provided), and the vibration amplitude of the piezoelectric thin film layer 3 is increased, thereby increasing a vibration emission amount (e.g., energy of the output ultrasonic wave) in a perpendicular direction (e.g., the vertical direction shown in FIG. 2G). For example, due to the increased vibration amplitude of the piezoelectric thin film layer 3, the ultrasonic fingerprint recognition sensor can emit more energy (i.e., energy of the ultrasonic wave output by the ultrasonic fingerprint recognition sensor is made greater), thereby improving an emission amount of the ultrasonic fingerprint recognition sensor. When the ultrasonic wave emitted by the ultrasonic fingerprint recognition sensor is reflected by the fingerprint and reflected to the piezoelectric thin film layer 3, due to existence of the resonant cavity 4, the piezoelectric thin film layer 3 is caused to vibrate more easily by the same amount of reflection energy (e.g., when the energy of the ultrasonic wave reflected to the piezoelectric thin film layer 3 remains unchanged, the vibration amplitude of the piezoelectric thin film layer 3 is increased); because the vibration of the piezoelectric thin film layer 3 is converted into an electric signal for recognizing the fingerprint, in a case where the vibration amplitude of the piezoelectric thin film layer 3 increases, the electric signal output by the ultrasonic fingerprint recognition sensor increases (e.g., the amount of signal output by the ultrasonic fingerprint recognition sensor is increased), thereby improving detection sensitivity of the ultrasonic fingerprint recognition sensor.

For example, as shown in FIG. 2G a support body 6 is provided on the drive electrode 2; a protective layer 7 is provided on a side of the support body 6 that is away from the drive electrode 2; and the drive electrode 2, the support body 6 and the protective layer 7 together form the resonant cavity 4. Further, the resonant cavity 4 is a closed and airtight empty cavity. For example, the above-described empty cavity refers to that the cavity does not contain solids, liquids, etc., but the cavity may contain gas. For example, the resonant cavity 4 is an air cavity, that is, the resonant cavity 4 contains air. For example, the closed and airtight cavity refers to a cavity that has no gas exchange with the outside (i.e., the outside of the closed and airtight cavity).

For example, the ultrasonic fingerprint recognition sensor includes a plurality of support bodies 6; and heights of the plurality of support bodies 6 in a direction perpendicular to the ultrasonic fingerprint recognition sensor are substantially the same, so when no voltage is applied to the drive electrode 2 and the receiver electrodes 1, a distance between the drive electrode 2 and the protective layer 7 is uniform.

For example, as shown in FIG. 2G the support body 6 is located on a side of the drive electrode 2 that is away from the piezoelectric thin film layer 3; and the protective layer 7 is located on a side of the resonant cavity 4 that is away from the piezoelectric thin film layer 3. As shown in FIG. 2A, the ultrasonic fingerprint recognition sensor includes a plurality of receiver electrodes 1 that are spaced apart and a plurality of resonant cavities 4; and the resonant cavities 4 and the receiver electrodes 1 correspond to each other. Specifically, the plurality of receiver electrodes 1 that are spaced apart are provided on the base 5; and the plurality of receiver electrodes 1 are independent of each other (e.g., insulated from each other). A plurality of resonant cavities 4 that are spaced apart are provided on the drive electrode 2; and the plurality of resonant cavities 4 are independent of each other. The plurality of resonant cavities 4 are in one-to-one correspondence with the plurality of receiver electrodes 1; and the support bodies 6 are in one-to-one correspondence with gaps between receiver electrodes 1. For example, as shown in FIG. 2A, each of the plurality of resonant cavities 4 at least partially overlaps with a corresponding one of the receiver electrodes 1 in a direction perpendicular to the base 5; an orthogonal projection of each of the plurality of support bodies 6 on an electrode layer where the plurality of receiver electrodes 1 are located at least partially covers (e.g., completely covers) a gap between corresponding receiver electrodes 1. For example, as shown in FIG. 2A, an orthogonal projection of each of the plurality of resonant cavities 4 on the electrode layer where the plurality of receiver electrodes 1 are located at least partially covers (e.g., completely covers) a corresponding receiver electrode 1.

Figure 5:
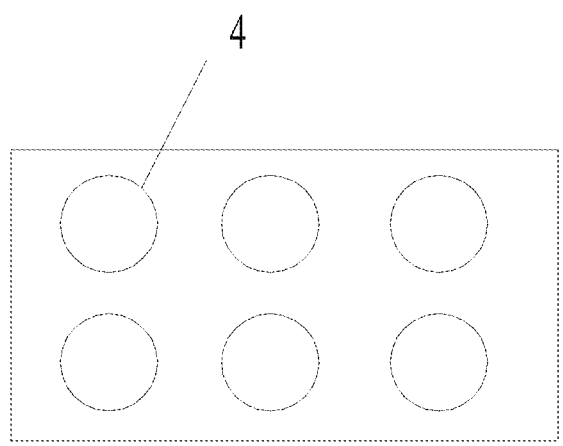
FIG. 5 is a first structural schematic diagram of a resonant cavity in an ultrasonic fingerprint recognition sensor provided by some embodiments of the present disclosure.
Figure 6:
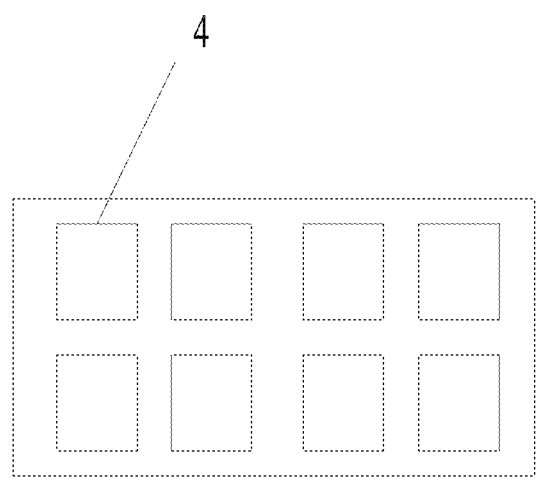
FIG. 6 is a second structural schematic diagram of a resonant cavity in an ultrasonic fingerprint recognition sensor provided by some embodiments of the present disclosure.

FIG. 5 is a first structural schematic diagram of the resonant cavity in the ultrasonic fingerprint recognition sensor provided by some embodiments of the present disclosure; and FIG. 6 is a second structural schematic diagram of the resonant cavity in the ultrasonic fingerprint recognition sensor provided by some embodiments of the present disclosure. For example, the structural schematic diagrams of FIG. 5 and FIG. 6 are plan schematic diagrams. For example, as shown in FIG. 5 and FIG. 6, the resonant cavity 4 may have any shape, as long as the resonant cavity 4 can increase the vibration amplitude of the piezoelectric thin film layer 3. For example, the shape of the cross section of the resonant cavity 4 (e.g., a cross section acquired by cutting the resonant cavity 4 with a plane parallel to the base 5) is polygonal, circular or elliptical; correspondingly, the shape of the orthogonal projection of the resonant cavity 4 on the base 5 is polygonal, circular or elliptical. For example, the shape of the cross section of the resonant cavity 4 is circular, as shown in FIG. 5. Alternatively, the shape of the cross section of the resonant cavity 4 is rectangular, as shown in FIG. 6.

For example, a material of the piezoelectric thin film layer 3 is selected from polyvinylidene fluoride, aluminum nitride, lead zirconate titanate piezoelectric ceramics or zinc oxide. For example, the piezoelectric thin film layer 3 may also be made of other suitable organic piezoelectric materials or inorganic piezoelectric materials.

For example, a polarization direction of the piezoelectric thin film layer 3 has a component in a direction perpendicular to the base 5, so when a voltage is applied to at least one of the drive electrode 2 and the receiver electrode 1, the piezoelectric thin film layer 3 is deformed. For example, by applying an alternating-current voltage to the drive electrode 2, the piezoelectric thin film layer 3 can be deformed in opposite directions. In an example, the receiver electrode 1 is grounded, as shown in FIG. 3, by applying a positive voltage to the drive electrode 2, a region, that overlaps with the receiver electrode 1, of the piezoelectric thin film layer 3 is closer to the protective layer 7 as compared with other regions of the piezoelectric thin film layer 3, that is, the region, that overlaps with the receiver electrode 1, of the piezoelectric thin film layer 3 moves toward the protective layer 7; as shown in FIG. 4, by applying a negative voltage to the drive electrode 2, the region, that overlaps with the receiver electrode 1, of the piezoelectric thin film layer 3 is farther away from the protective layer 7 as compared with other regions of the piezoelectric thin film layer 3, that is, the region, that overlaps with the receiver electrode 1, of the piezoelectric thin film layer 3 moves away from the protective layer 7. For example, the polarization direction of the piezoelectric thin film layer 3 is parallel to the direction of the base 5, to increase conversion efficiency of the piezoelectric thin film layer 3, for example, improve efficiency of converting mechanical vibration caused by the sound wave into an electric signal and efficiency of converting the alternating-current voltage into mechanical motion.

As shown in FIG. 2A, the drive electrode 2 is a transparent electrode. For example, the drive electrode 2 is a transparent planar electrode. The drive electrode 2 covers the entire piezoelectric thin film layer 3. For example, an orthogonal projection of the drive electrode 2 on the base 5 completely covers an orthogonal projection of the piezoelectric thin film layer 3 on the base 5. For example, the drive electrode 2 may be made of a transparent conductive material. For example, the transparent conductive material is indium tin oxide (ITO) or indium zinc oxide (IZO). For example, the drive electrode 2 is an ITO electrode. For example, the drive electrode 2 may be made of silver or any other suitable conductive material. For example, the receiver electrode 1 may be formed by using a transparent conductive material or any other suitable material. The ultrasonic fingerprint recognition sensor provided by some embodiments of the present disclosure increases the vibration amplitude of the piezoelectric thin film layer by providing the resonant cavity, so that the ultrasonic fingerprint recognition sensor can emit more energy, that is, to make energy of the ultrasonic wave emitted by the ultrasonic fingerprint recognition sensor increased, which increases the emission amount of the ultrasonic fingerprint recognition sensor. When the emitted ultrasonic wave is reflected back after encountering the fingerprint, a reflected ultrasonic wave with the same energy is easier to make the piezoelectric thin film layer vibrate, that is, increase the vibration amplitude of the piezoelectric thin film layer; because the vibration of the piezoelectric thin film layer is converted into an electric signal (e.g., positive and negative charges are formed), and an electric signal for recognizing the fingerprints is formed, the increased vibration amplitude of the piezoelectric thin film layer increases signal amounts received and output by the ultrasonic fingerprint recognition sensor, and enhances detection sensitivity of the ultrasonic fingerprint recognition sensor. For example, when part region (e.g., the region overlapping with the receiver electrode 1) of the piezoelectric thin film layer is farther away from the protective layer 7 (i.e., the volume of the resonant cavity 4 increases), a positive charge is formed; when part region (e.g., the region overlapping with the receiver electrode 1) of the piezoelectric thin film layer is closer to the protective layer 7 (i.e., the volume of the resonant cavity 4 is reduced), a negative charge is formed.

An embodiment of the present disclosure further provides a manufacturing method of an ultrasonic fingerprint recognition sensor, comprising: forming a receiver electrode; forming a piezoelectric thin film layer on the receiver electrode; forming a drive electrode on the piezoelectric thin film layer; and forming a resonant cavity on the drive electrode. For example, the forming a resonant cavity on the drive electrode includes: forming a sacrificial layer on the drive electrode; forming a support layer on the sacrificial layer, and forming a hole, that penetrates the support layer and connects with the sacrificial layer, in the support layer; etching, through the hole that penetrates the support layer, the region, corresponding to the hole that penetrates the support layer, of the sacrificial layer to form a groove; and forming a protective layer covering the groove on the support layer, so as to form the resonant cavity.

For example, the support layer is made of polystyrene or any other suitable material; and the protective layer is made of epoxy resin or any other suitable material.

For example, the receiver electrode, the piezoelectric thin film layer, and the drive electrode may be formed by using related manufacturing processes, and no details will be described here.

In some embodiments, the ultrasonic fingerprint recognition sensor may be configured in any suitable electronic device to achieve the objective of identity recognition through fingerprint recognition. The electronic device may be: a mobile phone, a tablet personal computer, a television, a monitor, a laptop, a digital photo frame, a navigator, and any other product or component having a display function.

Figure 7:
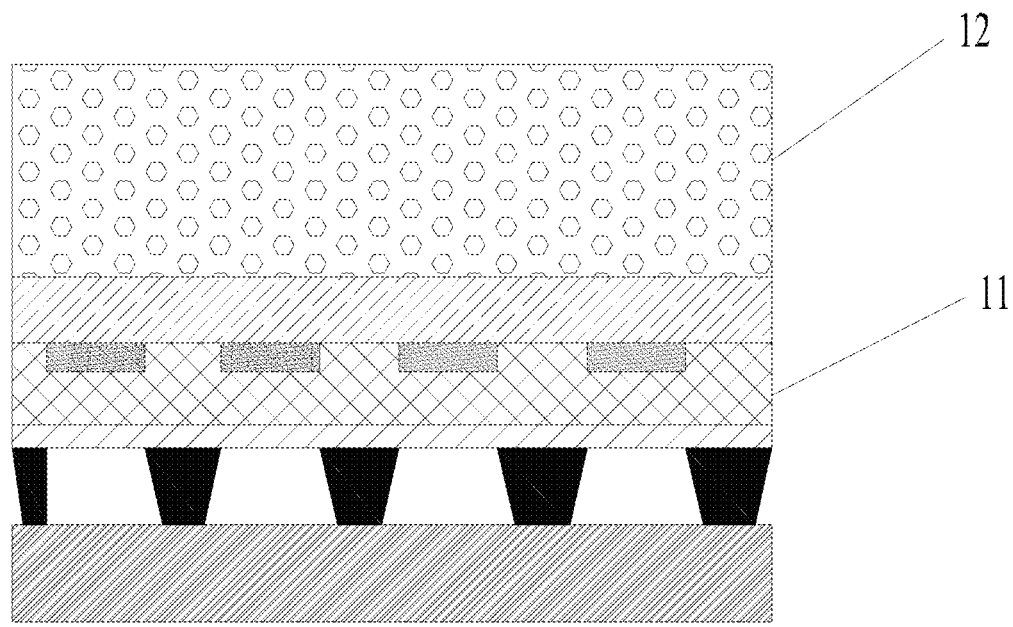
FIG. 7 is a structural schematic diagram of a display device provided by some embodiments of the present disclosure.

FIG. 7 is a structural schematic diagram of a display device provided by some embodiments of the present disclosure. As shown in FIG. 7, some embodiments of the present disclosure further provide a display device, which comprises the above-described ultrasonic fingerprint recognition sensor 11 and a display unit 12 (e.g., a display panel); and the display unit 12 and the ultrasonic fingerprint recognition sensor 11 are connected by bonding and attaching. The display unit 12 includes a glass substrate and a light-emitting unit provided on the glass substrate. For example, the glass substrate 122 and the light-emitting unit 121 are bonded by an optical adhesive 124.

For example, an ultrasonic wave emitted by the ultrasonic fingerprint recognition sensor 11 passes through the display unit 12 and is reflected after encountering a fingerprint, and then passes through the display unit 12, propagates toward and is incident onto the ultrasonic fingerprint recognition sensor 11.

The light-emitting unit provided by some embodiments of the present disclosure is an organic light-emitting unit or an inorganic light-emitting unit; the organic light-emitting unit is, for example, an organic light-emitting diode, and the organic light-emitting diode may be of various types, for example, a top-emitting type or a bottom-emitting type, and may be a polymer type or a small molecular type, and so on.

Figure 8:
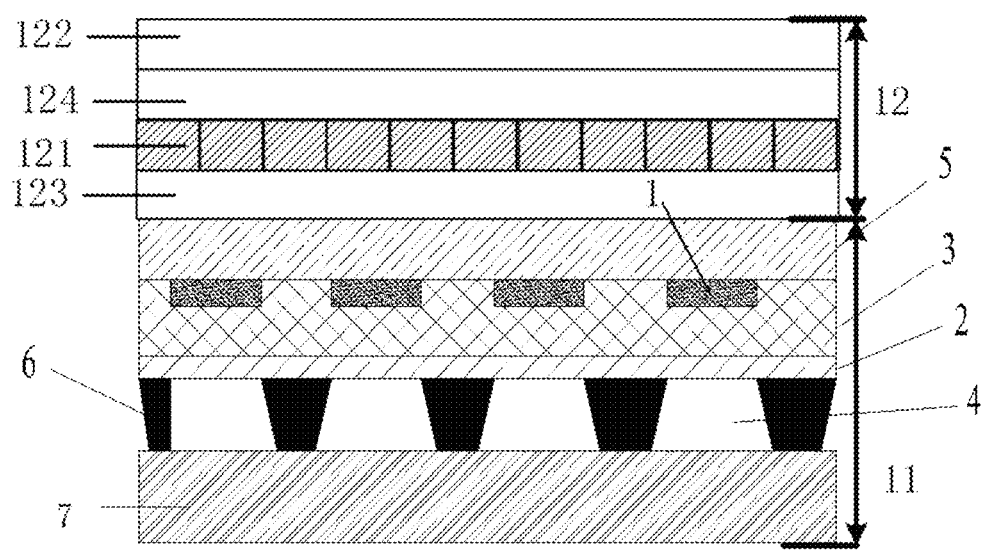
FIG. 8 is another structural schematic diagram of a display device provided by some embodiments of the present disclosure.

For example, the ultrasonic fingerprint recognition sensor 11 is arranged on a side of the glass substrate of the display unit 12 that is away from the light-emitting unit. For another example, the ultrasonic fingerprint recognition sensor and the light-emitting unit may be on the same side of the glass substrate of the display unit 12, that is, the ultrasonic fingerprint recognition sensor is provided on a side of the glass substrate of the display unit 12 that is closer to the light-emitting unit. In some examples, as shown in FIG. 8, the glass substrate 122 serves as a protective cover and is located on a side of the light-emitting unit 121 of the display unit 12 that is away from the ultrasonic fingerprint recognition sensor 11.

It should be noted that, in some examples, other suitable substrates may be used to replace the above-described glass substrate; for example, other suitable substrates include at least one of a quartz substrate, and a plastic substrate (e.g., a polyethylene terephthalate (PET) substrate).

For example, the ultrasonic fingerprint recognition sensor 11 covers the entire display unit 12, that is, the ultrasonic fingerprint recognition sensor 11 and the display unit 12 have a same size, to implement a full-screen fingerprint recognition and full-screen touch function of the display device according to this embodiment.

For example, the display unit 12 is an organic light-emitting diode (OLED) display panel or a quantum dot display panel. For example, the display unit 12 further includes a driving substrate 123. For example, the light-emitting unit 121, the driving substrate 123 (not shown in FIG. 7, referring to FIG. 8), and the ultrasonic fingerprint recognition sensor 11 are sequentially arranged in a direction perpendicular to the display device. For example, the display unit 12 includes a plurality of display pixels (e.g., display pixels arranged in an array), and each display pixel includes at least one light-emitting unit. For example, the driving substrate includes a pixel circuit (e.g., a plurality of pixel circuits arranged in an array); and the pixel circuit includes a suitable number of thin film transistors and storage capacitors.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. An ultrasonic fingerprint recognition sensor, comprising: a plurality of receiver electrodes, a drive electrode, a piezoelectric thin film layer and a plurality of resonant cavities,
    wherein the piezoelectric thin film layer is between the plurality of receiver electrodes and the drive electrode; and
    the plurality of resonant cavities are on a side, closer to the piezoelectric thin film layer, of the plurality of receiver electrodes, and are configured to increase vibration amplitude of the piezoelectric thin film layer,
    wherein the plurality of resonant cavities are spaced apart from and independent of each other, and the drive electrode continuously extends across the plurality of the resonant cavities.

2. The ultrasonic fingerprint recognition sensor according to claim 1, wherein the plurality of resonant cavities are on a side, away from the piezoelectric thin film layer, of the drive electrode.

3. The ultrasonic fingerprint recognition sensor according to claim 1, wherein a support body is provided on a side, away from the piezoelectric thin film layer, of the drive electrode;
    a protective layer is provided on a side, away from the drive electrode, of the support body; and
    the drive electrode, the support body and the protective layer together form the plurality of resonant cavities.

4. The ultrasonic fingerprint recognition sensor according to claim 1, wherein the plurality of resonant cavities are between the piezoelectric thin film layer and the drive electrode.

5. The ultrasonic fingerprint recognition sensor according to claim 1, wherein the plurality of resonant cavities are located between the piezoelectric thin film layer and the plurality of receiver electrodes.

6. The ultrasonic fingerprint recognition sensor according to claim 1, wherein at least one of the plurality of resonant cavities is a closed and airtight empty cavity.

7. The ultrasonic fingerprint recognition sensor according to claim 1, wherein a shape of an orthogonal projection of each of the plurality of resonant cavities on the drive electrode is polygonal, circular or elliptical.

8. The ultrasonic fingerprint recognition sensor according to claim 1, wherein the plurality of receiver electrodes are spaced apart from each other; and
    each of the plurality of resonant cavities overlaps with a corresponding one of the receiver electrodes in a direction perpendicular to the ultrasonic fingerprint recognition sensor.

9. The ultrasonic fingerprint recognition sensor according to claim 1, wherein the drive electrode is a transparent planar electrode; and the drive electrode covers the piezoelectric thin film layer.

10. The ultrasonic fingerprint recognition sensor according to claim 1, further comprising a driving circuit,
    wherein the driving circuit is configured to at least apply a voltage to the drive electrode, and change a polarity of a difference between a voltage on the drive electrode and a voltage on a corresponding one of the plurality of receiver electrodes, in an ultrasonic wave generation phase.

11. The ultrasonic fingerprint recognition sensor according to claim 1, further comprising a base, wherein the base comprises a signal readout circuit;
    and the signal readout circuit is electrically connected with the plurality of receiver electrodes.

12. A display device, comprising: the ultrasonic fingerprint recognition sensor according to claim 1, and a display panel, wherein the ultrasonic fingerprint recognition sensor is attached onto a non-light emitting side of the display panel.

13. The display device according to claim 12, wherein the ultrasonic fingerprint recognition sensor completely covers the display panel in a direction perpendicular to the display device.

14. The display device according to claim 12, wherein the display panel comprises a light-emitting unit and a driving substrate;
    the ultrasonic fingerprint recognition sensor further comprises a protective layer and a base; and
    the protective layer, the plurality of resonant cavities, the drive electrode, the piezoelectric thin film layer, the plurality of receiver electrodes, the base, the driving substrate, and the light-emitting unit are sequentially arranged in the direction perpendicular to the display device.

15. The display device according to claim 12, wherein the display panel is an organic light-emitting diode display panel or a quantum dot display panel.

16. A manufacturing method of the ultrasonic fingerprint recognition sensor according to claim 1, comprising:
    forming the plurality of receiver electrodes;
    forming the piezoelectric thin film layer on the plurality of receiver electrodes;
    forming the drive electrode on the piezoelectric thin film layer; and
    forming the plurality of resonant cavities on the drive electrode.

17. The manufacturing method of the ultrasonic fingerprint recognition sensor according to claim 16, wherein the forming the plurality of resonant cavities on the drive electrode comprises:
    forming a sacrificial layer on the drive electrode;

forming a support layer on the sacrificial layer, and forming a hole, that penetrates the support layer and connects with the sacrificial layer, in the support layer;

etching, through the hole that penetrates the support layer, a region, corresponding to the hole that penetrates the support layer, of the sacrificial layer, to form a groove; and forming a protective layer covering the groove on the support layer, so as to form the plurality of resonant cavities.

18. An ultrasonic fingerprint recognition sensor, comprising: a receiver electrode, a drive electrode, a piezoelectric thin film layer and a resonant cavity, wherein the piezoelectric thin film layer is between the receiver electrode and the drive electrode; and the resonant cavity is on a side, closer to the piezoelectric thin film layer, of the receiver electrode, and is configured to increase vibration amplitude of the piezoelectric thin film layer, wherein the resonant cavity is located between the piezoelectric thin film layer and the drive electrode, or the resonant cavity is located between the piezoelectric thin film layer and the receiver electrode.

\* \* \* \* \*